United States Patent [19]
Gontowski

[11] Patent Number: 4,931,750
[45] Date of Patent: Jun. 5, 1990

[54] VOLTAGE CONTROLLED OSCILLATOR

[75] Inventor: Walter S. Gontowski, Thompson, Conn.

[73] Assignee: Cherry Semiconductor Corporation, East Greenwich, R.I.

[21] Appl. No.: 356,936

[22] Filed: May 25, 1989

[51] Int. Cl.[5] ............................................. H03K 3/26
[52] U.S. Cl. .................................. 331/111; 331/108 C; 331/143; 331/177 R
[58] Field of Search .................. 331/108 C, 111, 143, 331/177 R, 34, 108 R

[56] References Cited

U.S. PATENT DOCUMENTS 4,720,689  1/1988  Gontowski, Jr. ................... 331/111
4,734,656  3/1988  Miller ................................... 331/111

Primary Examiner—David Mis
Attorney, Agent, or Firm—Robert M. Asher; Henry D. Pahl, Jr.

[57] ABSTRACT

In the voltage controlled oscillator disclosed herein, the charging and discharging of a timing capacitor is controlled by a differential input comparator which establishes precisely defined switching thresholds. The comparator input circuit is provided with an internally generated, temperature compensated input bias current which substantially relieves the timing components from providing bias current, thereby facilitating a wide range of operation.

9 Claims, 1 Drawing Sheet

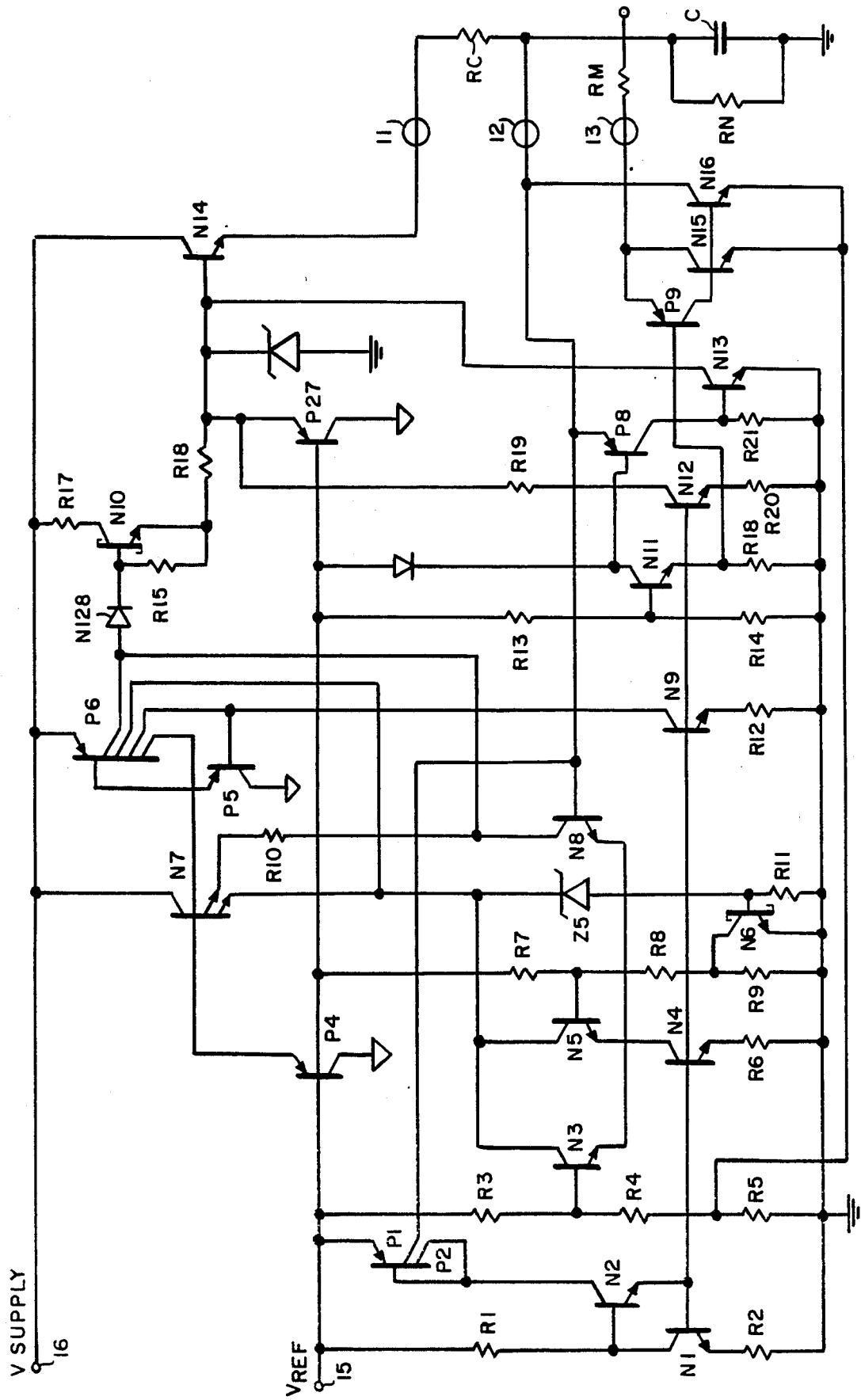

VOLTAGE CONTROLLED OSCILLATOR

BACKGROUND OF THE INVENTION

The present invention relates to a voltage controlled oscillator and more particularly to such an oscillator which is operable over a wide and accurately definable range of frequencies.

In various analog control systems, it is often desirable to utilize a voltage controlled oscillator. For example, in resonant mode power supplies, an electronic switch is periodically turned on applying a pulse of current to a resonant tank circuit. The input power to the tank circuit is controlled by varying the rate of pulsing, e.g. by means of a voltage controlled oscillator, in response to a control voltage. The control voltage is typically the output of an error amplifier which compares the power supply output voltage to a known reference. It is desirable that the voltage controlled oscillator in such an application have a wide dynamic range and the ability to operate at a relatively high frequency, e.g. greater than one megahertz. Further, the operating characteristics of the voltage controlled oscillator should be stable with temperature and it is desirable that the maximum and minimum frequencies can be accurately selected or defined.

Among the several objects of the present invention may be noted the provision of a voltage controlled oscillator which is operable over a wide dynamic range; the provision of such an oscillator whose operating characteristics are stable with temperature; the provision of such an oscillator which is operable at high frequency; the provision of such an oscillator which has a highly linear response; the provision of such an oscillator whose minimum and maximum frequencies can be externally defined by relatively simple means; the provision of such an oscillator which is highly reliable and which is of relatively simple and inexpensive construction. Other objects and features will be in part apparent and in part pointed out hereinafter.

BRIEF DESCRIPTION OF THE INVENTION

The voltage controlled oscillator of the present invention employs a timing capacitor which is alternately charged and discharged. Switch means are provided for selectively charging the capacitor, typically at a relatively rapid rate, and a voltage controlled current source is provided for discharging the capacitor at a rate which is a function of an externally supplied control voltage. The voltage on the capacitor is sensed by means of a differential input circuit comprising at least two transistors, the emitters of which are connected together. The base of one of the input circuit transistors is connected to a reference voltage source and the base of the other is connected to the capacitor. An essentially constant current is applied to the emitters of the input circuit transistors by bias circuitry including at least two transistors whose bases are connected together and whose emitters are provided with respective current value determining resistors. A selected value of current is applied to the collector of a first one of the bias circuit transistors thereby to establish a corresponding constant current sink at the collector of the second of the transistors, this collector being connected to the emitters of the input circuit transistors. The base of a buffer transistor, similar in type to the input circuit transistors is connected to the collector of the first bias circuit transistor and its emitter is connected to the base terminals of the two bias circuit transistors. Accordingly, the collector circuit in the buffer transistor is essentially proportional to the collector currents in the input circuit transistors and inversely proportional to their gains. The collector current of the buffer transistor is applied as an input to a current mirror circuit which provides to the base of the input transistor connected to said capacitor a compensated bias current which substantially relieves the capacitor timing from providing input current to the comparator.

BRIEF DESCRIPTION OF THE DRAWING

The single FIGURE is a schematic circuit diagram of a voltage controlled oscillator constructed in accordance with the present invention.

DESCRIPTION OF THE PREFERRED EMBODIMENT

Referring now to the drawing, the circuitry illustrated there is, except for certain external timing components, adapted to be constructed on a single integrated circuit chip utilizing bipolar technology. The external timing components may be connected to the integrated circuits through terminals designated by reference characters 11, 12 and 13. An external timing capacitor C is typically connected between ground and the terminals 11 and 12 as indicated. Capacitor C is typically shunted by a resistor RN which establishes a minimum rate of oscillation as described hereinafter. An externally supplied control voltage, i.e. derived from an error amplifier (not shown), is applied to the input terminal 13 through a resistor RM. For a given range of control voltages, the value of resistor RM determines the maximum frequency of oscillation, also as described in greater detail hereinafter.

A standard, highly regulated, logic level supply voltage, e.g. 5.1 volts, is applied to the circuitry through an input terminal 15 and a somewhat higher supply voltage, e.g. 7 to 20 volts, is applied through a terminal 16.

Charging of the capacitor is effected by an emitter follower transistor N14 which is in turn driven by emitter follower transistor N10. Charging current to the capacitor C is limited by an external resistor RC. While both of these transistors draw collector current from the higher voltage supply lead, charging of the capacitor is limited to the lower supply voltage, i.e. 5.1 volts, by transistor P27 which shunts drive current to the transistor N14 when the base voltage of transistor N14 exceeds the lower supply voltage by one base-emitter drop. In this regard, it will be understood by those skilled in the art that the base-emitter drops of transistors P27 and N14 essentially cancel each other out. Further, as the voltage on the capacitor approaches the 5.1 volt level, the rate of charging is somewhat slowed or braked by the operation of transistors P8 and N13. As the capacitor voltage approaches the lower supply voltage, the base-emitter junction of P8 goes from reverse bias to forward bias, conduction through its collector circuit tends to turn on transistor N13 which in turn shunts drive current from the output transistor N14. This so-called active braking reduces overshoot at high frequencies which might otherwise occur due to the internal propagation delays within the circuitry.

Discharging of timing capacitor C is provided by a voltage controlled current source comprising transistors N11, P9, N15 and N16. These elements are interconnected to provide a very linear, highly temperature compensated current source as described in greater detail in copending, co-assigned application Ser. No. 343,884 now U.S. Pat. No. 4,885,525 filed Apr. 26, 1989 and entitled Voltage Controllable Current Source. Briefly, a voltage divider comprising resistors R13 and R14 establishes a reference voltage at the base of transistor N11. The input resistor R2 is connected to the emitter of transistor P9. The base-emitter drops of transistors N11 and P9 essentially offset each other so that P9 conducts a current which is essentially proportional to the extent to which the external control voltage exceeds the reference voltage. Transistors N15 and N16 operate as a current mirror to sink a current from the timing capacitor which is highly proportional to the input current. Rather than being connected directly to the ground lead, the emitters of transistors N15 and N16 are returned to ground through resistor R5 for reasons described in greater detail hereinafter.

Switching between charging and discharging of the timing capacitor is effected by a three input comparator circuit comprising transistors N3, N5 and N8. The upper threshold, i.e. the point at which the mode switches from charging to discharging is established by a voltage divider comprising resistors R7 and R8 which sets a preselected voltage at the base of transistor N5. The lower threshold, i.e. the level at which the mode changes from discharging to charging, is set by means of a voltage divider comprising resistors R3, R4 and R5 which apply an appropriate voltage to the base of transistor N3. The input terminal 12, to which the timing capacitor is connected, is connected to the base of transistor N8. Basically, this lead constitutes the sensing or input terminal of the control circuitry.

The comparator input transistors N3, N5 and N8, and certain other parts of the system, are provided with constant current supplies or biases by means of current bias circuitry comprising inter alia transistors N1, N4, N9 and N12. These transistors are similar in type to the comparator transistors N3, N5 and N8 and are preferably formed on the same integrated circuit chip so that gains and temperature coefficients match closely. The base terminals of these transistors are connected together and their emitters are provided with respective current level defining resistors R2, R6, R12 and R20. A preselected current is applied to the collector of transistor N1 through a resistor R1. The base terminal of a buffer transistor N2 is also connected to the collector of transistor N1, the emitter of transistor N2 being connected to the bases of transistors N1, N4, N9 and N12. The buffer transistor N2 is similar in type to the comparator input transistors as well as to the bias circuit transistors. As is understood by those skilled in the art, the collectors of each of the transistors N4, N9 and N12 will conduct an essentially constant current having a value which is in proportion to the respective emitter resistor.

The collector current of transistor N9 is applied to a current mirror circuit comprising transistors P5 and P6. The emitter of transistor P6 is connected to the higher voltage supply lead. The multiple collectors of transistor P6 provide high source impedance current sources to the various parts of the control circuitry. The uppermost collector of transistor P6 provides collector current to comparator transistor N8 and this point is also connected, through diode N128, to the base of the charging switch transistor N10. Thus, when N8 is cut off, charging of the timing capacitor is enabled. The second collector of transistor P6 similarly provides collector current to the transistors N3 and N5. The voltage at the collector of transistor N8 is also limited or clipped so as to not to drop below the lower supply voltage by means of a circuit which comprises transistors P4 and N7. A voltage equal to the lower supply voltage plus one base-emitter drop is established at the emitter of transistor P4. Accordingly, transistor N7 will conduct when the voltage at either emitter drops below the lower supply voltage. One emitter of transistor N7 is connected to the collector of input transistor N8 and the other is connected to the collectors of input circuit transistors N3 and N5. This action prevents saturation of the transistors N3, N5 and N8 so as to facilitate high speed switching.

The collectors of transistors N3 and N5 are connected, through a Zener diode Z5 which effects level shifting, to the base of transistor N6. Accordingly, when both N3 and N7 are off, transistor N6 will be turned on.

The general operation of the above-described oscillator circuit is as follows. Assuming initially that the capacitor C is discharged, and the voltage at input terminal 12 is below the reference voltages provided at the bases of transistors N3 and N5, the transistor N8 will be cut off and thus drive current will be available to the base of transistor N10 which will in turn, turn on the output transistor N14 causing rapid charging of the capacitor. When the voltage on the capacitor becomes equal to the reference or threshold voltage at the base of transistor N5, transistor N8 will start to conduct. This conduction will shunt drive current away from the output switch circuitry and, through emitter cross-coupling, will reduce conduction through the transistor N5. As conduction through N5 is cut off, the voltage at its collector will rise and, through the level shifting Zener diode Z5, the transistor N6 will turn on. Conduction through transistor N6 essentially shunts resistor R9 and causes the voltage at the base of transistor N5 to be reduced further, accelerating the switching action. The voltage at the base of transistor N5 will in fact be pulled close to ground so that the corresponding threshold will no longer be operative but rather a threshold established by the voltage at the base of transistor N3 will be effective as the comparator threshold. This basic, three input mode of operation is also described in coassigned U.S. Pat. No. 4,720,689 issued Jan. 19, 1988 to Walter S. Gontowski, Jr.

Once charging has been stopped and the comparator has switched over, the capacitor C will be discharged by the voltage controlled current source, i.e. the collector current flowing through transistor N16. As indicated previously, the discharge current is typically much smaller than the charging current and, thus, this phase of operation is essentially determinative of the frequency of oscillation. The voltage on capacitor C decreases during this discharge phase until it reaches the lower threshold established by the voltage at the base of transistor N3. At this point, conduction through transistor N8 decreases and, through emitter interaction, conduction through transistor N3 is initiated. Conduction through N3 drops the voltage at its collector and, through the level shifting Zener diode Z5, this voltage drop is transferred to the base of emitter N6 causing it to stop conduction. Accordingly, the voltage at the base of transistor N5 will rise causing additional conduction through N5 speeding the switchover. With N6 turned off, the voltage at the base of transistor N5 will rise quickly firmly establishing the comparator circuit in its state where all of the emitter bias current provided through transistor N5 to the comparator is flowing through N5 and transistor N8 is cut off. When N8 turns off, drive current is provided to the charging switch circuitry as described previously and thus the charging phase will begin again.

From the foregoing description, it can be understood that, during the relatively long discharge phase, the sensing transistor N8 is conducting and therefore requires that bias or input current be provided to its base terminal. If this input current is drawn from the timing components, i.e. the capacitor C, it will be understood that this current drain will itself establish a minimum frequency of operation, i.e. it will form a discharge path in parallel with the resistor RN. This current drain will thus correspondingly limit the mimimum frequency of operation and reduce the linearity of the response with respect to the externally supplied control voltage.

In order to reduce this source of error, a compensated bias current is applied to the base of transistor N8 by way of a current mirror comprising transistors P1 and P2. While the current mirror illustrated employs a transistor with multiple collectors, it will be understood by those skilled in the art that two separate transistors could also be used. The input current to the current mirror circuitry is derived from the current bias circuitry so as to be essentially proportional to the bias requirements of the transistor N8, including temperature compensation, in the following manner. As indicated previously, the currents through the current biasing transistors N4, N9 and N12 are determined by the current applied to the collector of transistor N1 as well as by the values of the respective emitter resistors. The base current drive which must be supplied to these transistors (N1, N4, N9 and N12) is thus proportional to that current and also inversely proportional to their gains. As indicated previously, the gains of these transistors are essentially matched particularly in the context of an integrated circuit implementation. Further, when transistor N8 is conducting, essentially all of the current flowing from the current source N4, flows through that one comparator circuit transistor, i.e. none of the current flows through the transistors N3 or N5. Further, its gain is also essentially matched to that of the bias circuitry transistors.

Since the base drive current to the current source transistors is provided through the buffer transistor N2, it can be seen that the collector current of transistor N2 is a measure of the bias current required to support conduction through these transistors at their respective levels. Further, since the collector current through input transistor N8 during the discharge phase is essentially the same as the collector current through the respective current bias transistor, the collector current of transistor N2 is thus also an accurate measure of the input current required to maintain transistor N8 at its level of conduction. The collector current from transistor N2 is applied as an input to the current mirror comprising transistors P1 and P2 to generate an output current which is essentially proportional thereto, i.e. at the P1 collector. This output current is applied to the base terminal of input transistor N8. By appropriately scaling the sizes of the collectors of transistors P1 and P2 in relation to the sizes of the current source transistors, the reflected current can be set at a level essentially equal to that required by the transistor N8. Further, insofar as this current level varies with temperature, the supplied bias current will accurately track the bias requirements.

Accordingly, the external timing components, e.g. the capacitor C, are essentially relieved of the burden of providing bias current to the transistor N8 and thus timing is determined essentially solely by the external components and not by input current drain. In particular, the low end of the range of operation of the oscillator can be accurately preselected by the value of the capacitor shunting resistor RN since the current passing through this resistor, rather than the bias input bias current, will determine the frequency of operation.

At relatively high operating frequencies, e.g. in the order of one megahertz, it has been found that propagation delays within the logic system can start to significantly effect the frequency of operation. In other words, the analog timing intervals tend to become short and comparable to the propagation delays. This effect causes the frequency of operation to be less proportional to the externally applied control voltage. In accordance with another aspect of the present invention, this effect is compensated for by shifting the bottom threshold slightly in response to input current. This shifting offsets the lower end overshoot which otherwise occurs due to continued discharging of the capacitor during the propagation delay.

As indicated previously, the emitters of transistors N15 and N16 are returned to the ground lead through resistor R5, rather than directly. Resistor R5 is included in the voltage divider which provides the lower or "bottom" reference voltage at the base of transistor N3 and resistor R5 is of relatively low value as compared with resistors R50 and R51. Thus, at low input currents, i.e. low operating frequencies, the presence of this resistor and the corresponding voltage drop has little effect on the value of the bottom threshold. However, at higher input currents, corresponding to higher operating frequencies, the current drawn by the transistors N15 and N16 through resistor R5 causes the "bottom" threshold to be raised. Since switching of the comparator will thus be initiated at an earlier time within the discharge phase, it can be seen that a change is effected which tends to offset or compensate for overshoot occurring due to propagation delays. By appropriately choosing component values, the offsetting can be adjusted to effectively nullify the error otherwise occurring due to these propagation delays.

Summarizing, it can be seen that the circuitry illustrated provides a wide range of operation by both extending the low range of operation by means of temperature compensated input bias compensation and, at the upper end of the range, by compensating for propagation delays. Thus, a very wide range of operation is obtained. Further, as may be desirable in certain applications, the effective range of operation can be easily predetermined by the values of a pair of external resistors.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

I claim:
1. A wide range voltage controlled oscillator comprising:
   a timing capacitor;

means for selectively charging said capacitor;

a voltage controlled current source for discharging said capacitor at a rate which is a function of an externally supplied control voltage;

current bias circuitry including at least two transistors whose bases are connected together and whose emitters are provided with respective current value determining resistors, said bias circuitry including also means for applying a preselected current to the collector of a first one of said two transistors thereby to establish a corresponding current at the collector of a second one of said transistors;

a differential, emitter-follower input circuit for controlling said charging means, said input circuit including at least two transistors which are similar in type to said bias circuitry transistors, the emitters of said input circuit transistors being connected in common to the collector of said second one of said current bias transistors, the base of one of said input circuit transistors being connected to a reference voltage source and the base of the other of said input transistors being connected to said capacitor;

a buffer transistor similar in type to said bias circuitry transistors, the base of said buffer transistor being connected to the collector of said first bias circuit transistor and the emitter of said buffer transistor being connected to the base terminals of said first and second bias circuit transistors for applying bias current thereto whereby the collector current in said buffer transistor is proportional to the collector currents in said first and second input circuit transistors and inversely proportional to their gains; and current mirror means having an input connected to the collector of said buffer transistor and an output connected to the base of said second input circuit transistor thereby to provide to said second input transistor a compensated bias current which prevents said capacitor from being discharged by the base current drawn by said second input transistor, whereby the discharging of said capacitor is controlled essentially solely by said voltage controlled current source.

2. A voltage controlled oscillator as set forth in claim 1 wherein said current mirror means comprises multiple collector transistor means of conductivity type complementary to the conductivity type of said bias circuitry transistors and having one collector connected to its own base and to the collector of said buffer transistor, another collector being the current mirror output.

3. A voltage controlled oscillator as set forth in claim 1 wherein said capacitor is shunted by a resistor the value of which determines the minimum frequency of operation of said oscillator.

4. A voltage controlled oscillator as set forth in claim 1 wherein said current source is a current mirror circuit and wherein the control voltage is applied to said current mirror circuit through a resistor the value of which essentially determines the maximum frequency of operation of said oscillator.

5. A bias compensated differential comparator responsive to the voltage applied to an input terminal, said comparator comprising:

current bias circuitry including at least two transistors whose bases are connected together and whose emitters are provided with respective current value determining resistors, said bias circuitry including also means for applying a preselected current to the collector of a first one of said two transistors thereby to establish a corresponding current at the collector of a second one of said transistors;

a differential, emitter-follower input circuit including at least two transistors which are similar in type to said bias circuitry transistors the emitters of said input circuit transistors being connected in common to the collector of said second one of said current bias transistors, the base of one of said input circuit transistors being connected to a reference voltage source and the base of the other of said input transistors being connected to said input terminal;

a buffer transistor similar in type to said bias circuitry transistors, the base of said buffer transistor being connected to the collector of said first bias circuit transistor and the emitter of said buffer transistor being connected to the base terminals of said first and second bias circuit transistors for applying bias current thereto, whereby the collector current in said buffer transistor is proportional to the collector currents in said first and second input circuit transistors and inversely proportional to their gains; and current mirror means having an input connected to the collector of said buffer transistor and an output connected to the base of said second input circuit transistor thereby to provide to said second input transistor a compensated bias current.

6. A comparator as set forth in claim 5 wherein said current mirror means comprises multiple collector transistor means of conductivity type complementary to the conductivity type of said bias circuitry transistors and having one collector connected to its own base and to the collector of said buffer transistor, another collector being the current mirror output.

7. A wide range voltage controlled oscillator comprising:

a timing capacitor;

means for selectively charging said capacitor;

a comparator for controlling said charging means for switching between charging and discharging modes, said comparator having one input which is responsive to the voltage on said capacitor and a second input for a threshold voltage;

means for providing a pair of supply voltages;

a voltage divider connected across said supply voltages for providing a threshold voltage which is intermediate said supply voltages; and a voltage controlled current source for discharging said capacitor at a rate which is a function of an externally applied voltage, said current source being interconnected with said voltage divider for causing said threshold voltage to vary as a function of the capacitor discharge current.

8. A wide range voltage controlled oscillator comprising:

a timing capacitor;

means for selectively charging said capacitor;

a comparator for controlling said charging means for switching between charging and discharging modes, said comparator having one input which is responsive to the voltage on said capacitor and a second input for a threshold voltage;

supply leads for providing a pair of supply voltages;

a voltage divider comprising first, second and third resistances connected across said supply leads for providing, between said second and third resistances, a threshold voltage which is intermediate said supply voltages; and a voltage controlled current source for discharging said capacitor at a rate which is a function of an externally applied voltage, said current source being connected to one of said supply leads through said third resistance thereby to cause said threshold voltage to vary as a function of the capacitor discharge current.

9. A wide range voltage controlled oscillator comprising:

a timing capacitor;

means for selectively charging said capacitor;

a voltage divider comprising first, second and third resistances connected in series across said supply leads for providing, between said first and second resistances, a threshold voltage which is intermediate said supply voltages;

current bias circuitry including at least two transistors whose bases are connected together and whose emitters are provided with respective current value determining resistors, said bias circuitry including also means for applying a preselected current to the collector of a first one of said two transistors thereby to establish a corresponding current at the collector of a second one of said transistors;

a differential, emitter-follower input circuit for controlling said charging means, said input circuit including at least two transistors which are similar in type to said bias circuitry transistors, the emitters of said input circuit transistors being connected in common to the collector of said second one of said current bias transistors, the base of one of said input circuit transistors being connected to said threshold voltage and the base of the other of said input transistors being connected to said capacitor;

a buffer transistor similar in type to said bias circuitry transistors, the base of said buffer transistor being connected to the collector of said first bias circuit transistor and the emitter of said buffer transistor being connected to the base terminals of said first and second bias circuit transistors for applying bias current thereto whereby the collector current in said buffer transistor is proportional to the collector currents in said first and second input circuit transistors and inversely proportional to their gains;

current mirror means having an input connected to the collector of said buffer transistor and an output connected to the base of said second input circuit transistor thereby to provide to said second input transistor a compensated bias current which prevents said capacitor from being discharged by the base current drawn by said second input transistor, whereby the discharging of said capacitor is controlled essentially solely by said voltage controlled current source; and a voltage controlled current source for discharging said capacitor at a rate which is a function of an externally applied voltage, said current source being connected to one of said supply leads through said third resistance thereby to cause said threshold voltage to vary as a function of the capacitor discharge current.

* * * * *